United States Patent [19]

Nishizawa et al.

[11] 4,247,612
[45] Jan. 27, 1981

[54] METHOD OF FORMING FLUORESCENT SCREENS OF COLOR PICTURE TUBES

[75] Inventors: Masahiro Nishizawa; Hiroshi Yokomizo; Yoshifumi Tomito, all of Mobara; Saburo Nonogaki, Tokyo; Toshikatsu Manabe, Oume, all of Japan

[73] Assignee: Hitachi, Ltd., Tokyo, Japan

[21] Appl. No.: 64,739

[22] Filed: Aug. 8, 1979

[51] Int. Cl.³ .............................................. G03C 5/00
[52] U.S. Cl. ................................. 430/28; 427/64; 427/68; 427/208.2; 430/143; 430/144
[58] Field of Search ............... 96/36.1, 75, 49, 91 R; 427/54, 64, 68, 207 A; 430/28, 144, 143

[56] References Cited

U.S. PATENT DOCUMENTS

| | | | |
|---|---|---|---|
| 3,224,895 | 12/1965 | Rebel | 96/36.1 X |
| 3,511,654 | 5/1970 | Kishida et al. | 430/144 |
| 3,585,034 | 6/1971 | Levinos | 96/36.1 X |
| 3,734,731 | 5/1973 | Jones et al. | 60/258 |
| 3,997,344 | 12/1976 | Schlesinger et al. | 96/33 |
| 4,100,321 | 7/1978 | Schlesinger et al. | 430/144 X |

FOREIGN PATENT DOCUMENTS 1103865  2/1968  United Kingdom.

Primary Examiner—Edward C. Kimlin
Attorney, Agent, or Firm—Charles E. Pfund

[57] ABSTRACT

In a method of forming a fluorescent screen on the inner surface of a face plate of a color picture tube wherein a film of photosensitive composition consisting essentially of a diazonium salt, the portions of the films to be deposited with phosphors are exposed to light through a color selection electrode so as to impart sticky property to the portions by a photoreaction and moisture in atmosphere and then a powder of phosphors is deposited by utilizing the sticky property, a photosensitive binder is incorporated into photosensitive film which undergoes a cross-linkage reaction with the photosensitive composition, thus rendering the mixture insoluble in water.

4 Claims, 4 Drawing Figures

METHOD OF FORMING FLUORESCENT SCREENS OF COLOR PICTURE TUBES

BACKGROUND OF THE INVENTION

This invention relates to a method of forming a fluorescent screen of a color picture tube in which phosphor powders in a dry state are coated on the face plate of the color picture tube in a so-called dry process.

For the purpose of causing respective picture elements of a picture to emit fluorescent lights of three primary colors, the fluorescent screen of a color picture tube is so constructed as to comprise phosphor films of three colors in which dots or stripes of the phosphors are coated in a regular pattern. One method of coating in disclosed in U.S. patent application Ser. No. 895,372 filed by Saburo Nongaki et al on Apr. 11, 1978 and assigned to the same assignee.

According to the method disclosed therein, a film of photosensitive substance is coated on the inner surface of a face plate, and the portions of the film at which phosphors of a predetermined color are to be coated are exposed to light through a shadow mask to utilize a photoreaction created therein for the purpose of coating the phosphors. More particularly, a film of a photosensitive composition containing a diazonium salt as a major constituent is coated on the inner surface of the face plate and portions of the film at which the phosphors are to be coated are exposed to light. Then, zinc chloride formed in the exposed portions by photoreaction absorbs moisture in the atmosphere to become sticky so that when a powder of phosphors for emitting desired fluorescent colors is blasted onto the inner surface of the face plate, the phosphor powder will adhere only to the portions of the photosensitive film that have become sticky. After performing blasting and sticky coating of respective phosphors of three colors, the surface of the photosensitive film is treated with ammonia gas to render the portions of the photosensitive film to which the phosphor powder has been adhered insoluble in water, thereby fixing these portions. Then, surface remainders are washed away with an organic solvent thus forming a fluorescent screen. This method is one of the so-called dry types, and when compared with a conventional method in which phorsphors of respective colors are formed as photosensitive slurries which are sequentially coated, washed with water and developed, this dry process is advantageous in that only one step of coating a film of the photosensitive composition is sufficient, that it is possible to blast the phosphors in the form of a powder, and that surplus phosphor powders that had not adhered can be blown away with air spray for recovery purpose, thus increasing the efficiency of utilization of the phosphors. However, in the prior art method, there needs an independent step of rendering sticky portions at which the phosphors are to be coated insoluble in water for the purpose of fixing these portions.

SUMMARY OF THE INVENTION

Accordingly, it is an object of this invention to provide an improved method of forming a fluorescent screen of a color picture tube that can eliminate the fixing step with ammonia gas, thereby simplifying the process steps.

According to this invention, there is provided a method of forming a fluorescent screen of a color picture tube of the type wherein a photosensitive film coated on the inner surface of a face plate of the color picture tube is exposed to light through a color selection electrode, and a powder of phosphors is deposited on the exposed portions of the film, characterized in that a thin film of a mixture of a photosensitive composition and a photosensitive binder is applied onto the inner surface of the face plate, that the film has different powder accepting capabilities between portions thereof exposed and not exposed to light, that the photosensitive composition and the photosensitive binder undergo a cross-linkage reaction when exposed to light thereby becoming insoluble in water, that the film is exposed to light through a color selection electrode to form a pattern of exposed portions in the film, that a powder of phosphors is deposited on the pattern in accordance with the difference in the phosphor powder accepting capabilities and that the film is simultaneously fixed.

More particularly, according to this invention, a photosensitive composition consisting essentially of a diazonium salt in a film-forming resin is incorporated with a small quantity of a photosensitive binder, for example ammonium dichromate, a diazo resin such as Diazo Resin A, which is different from diazonium salt, or a benzene chloride diazonium salt to form a mixture. The mixture is coated on the inner surface of the face plate to form a thin film, and then the film is exposed to light through a shadow mask. At the exposed portions of the film, the photosensitive composition and the photosensitive binder undergo a photoreaction and the decomposition of the diazonium salt and cross-linkage reaction of the composition and binder render the mixture sticky and insoluble in water. As a consequence, the fixing step with ammonia gas which has been necessary in the prior art method can be eliminated. Moreover, the cross-linkage reaction caused by light between the photosensitive composition and the photosensitive binder makes the mixture adhesive such that the phosphor powder deposited thereon will not be removed by washing with water, inorganic or organic solvent with the result that the fluorescent screen formed by depositing the phosphor powder can be washed thoronghly to remove unwanted reaction products and phosphor powder mixed with phosphors of other colors. Thus, it is possible to improve color purity and brightness and to decrease residuals remaining after baking.

DESCRIPTION OF THE PREFERRED EMBODIMENTS

Figure 1A:
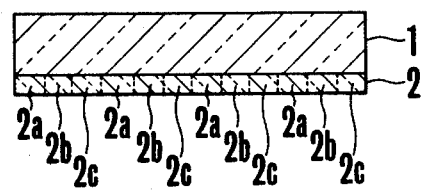
FIGS. 1a through 1d are sectional views showing successive steps of forming a fluorescent screen according to this invention.
Figure 1B:
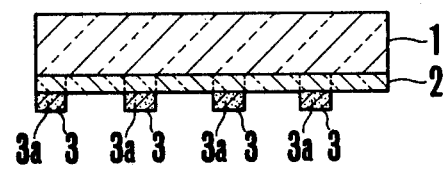

As shown in FIG. 1a, a mixture of a photosensitive composition and a binder, whose composition will be described later, is coated on the surface of a face plate of a 14" type color picture tube by a rotary coating process to form a film having a uniform thickness of about 0.6 to 1.0 micron. After drying the film, a shadow mask, not shown, is combined with the face plate and ultraviolet ray having an intensity of 15 to 20 W/m$^2$ is irradiated onto the film through the shadow mask for 2 to 3 minutes at portions 2a of the film on which a green phosphor is to be coated. Then, at the exposed portions 2a of the film 2 of the mixture, a diazonium salt undergoes decomposition to create zinc chloride which absorbs moisture in the atmosphere so that the exposed portions become sticky. Advantageously, the atmosphere at this time has a temperature of 25°±5° C. and a relative humidity of about 55±6%. Then, as shown in FIG. 1b, a green phosphor powder 3a is blasted against the portions 2a and air is then sprayed to form a pattern of green phosphor layer 3 at a quantity of 2.5 to 3 mg/cm$^2$ in which the green phosphor powder 3a has adhered to portions 2a alone which became sticky as the result of light exposure. The surplus green phosphor powder is blown away and recovered.

Figure 1C:
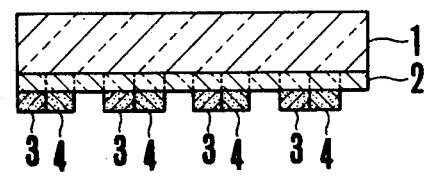
Figure 1D:
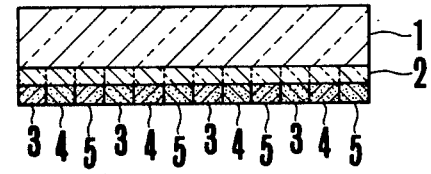

In the same manner, postions 2b of the film 2 is exposed to light through the shadow mask and a pattern of a blue phosphor layer 4 is formed on the portions 2b as shown in FIG. 1c. Thereafter, the portions 2c of the film 2 is again exposed to light through the shadow mask to form thereon a pattern of a red phosphor layer 5 as shown in FIG. 1d, thus forming dots or stripes of three color phosphors on the inner surface of the face plate 1.

In the phosphor dots or stripes formed by the method described above, ammonium dichromate and propylene alginate glycol ester in the composition undergo the cross-linkage reaction due to light exposure and become insoluble in water. For this reason, the ammonia gas fixing step of the prior art method becomes unnecessary in which after sequentially applying a layer of photosensitive composition and phosphor layers on the surface of the face plate, the assembly is placed in ammonium gas atmosphere so as to render the photosensitive layer insoluble in water, thereby fixing the same by the ammonia gas permeating through the interstices of the phosphor powder and reaching the photosensitive layer.

After wetting the entire surface of the fluorescent screen thus formed with a 0.2 to 0.3% (by weight, hereinafter all percents are weight %) aqueous solution of polyvinyl alcohol, 3 to 3.5% toluene solution of isobuthyl methacrylate resin was sprayed and then dried to form a lacquer film. Thereafter, an aluminum film is vapor deposited on the lacquer film to form a fluorescent screen.

Examples of the compositions are as follows.

| Composition 1 | |
|---|---|
| Propylene alginate glycol ester | 0.6% |
| P-N.N. dimethylamino benzene diazonium zinc chloride | 3.0% |
| Pluronic L-92, manufactured by Wyenbotte Chemical Co., (oxyethylene, oxypropylene block copolymer) | 0.003% |
| Ammonium dichromate | 0.02% |
| Water | balance |
| Composition 2 | |
| Polyvinyl alcohol | 0.2% |
| Propylene alginate glycol ester | 0.6% |
| P-N N dimethyl aminobenzen diazonium zinc chloride | 3.5% |
| Pluronic L-92 | 0.003% |
| Benzene chloride diazonium sulfonic acid soda | 0.03% |
| Water | balance |
| Composition 3 | |
| Propylene aliginate glycol ester | 0.6% |
| P-N.N. dimethyl aminobenzene diazonium zinc chloride | 3.0% |
| Pluronic L-92 | 0.003% |
| Diazo Resin A, manufactured by Tokyo Oka, Japan | 0.1% |
| Water | balance |

The ammonium dichromate in composition 1, the benzene chloride diazonium sulfonic acid soda in composition 2, and the Diaza Resin A, which is different from diazonium salt, in composition 3 respectively act as the photosensitive binder of this invention.

Whenever a photosensitive film is prepared from a liquid of any one of the compositions described above, the portions of the film exposed to light become insoluble in water so that it is possible to proceed to the succeeding steps including formation of a lacquer film and vapor deposition of an aluminum film without performing any independent fixing step as in the prior art, thus eliminating the independent fixing step.

As has been pointed out hereinbefore, as the cross-linkage reaction between the photosensitive composition and the binder is caused to proceed by the light used to exposure, so that the phosphors strongly adhere to the surface of the glass. Accordingly, the phosphor film can well withstand against such solvents as water, alcohol acetone, etc., such organic acids as acetic acid, tartaric acid, succinic acid, citric acid, oxalic acid, such inorganic acids as carbonic acid, hydrochloric acid, and such alkaline aqueous solution of ammonia and caustic soda so that after depositing three color phosphors, it is possible to remove unwanted reaction products and phosphors mixed with those of other colors by washing the phosphors with these solutions and solvents, thus improving color purity and brightness of the fluorescent screen and decreasing the baking residuals.

As described above, according to this invention, it is possible to simplify the manufacturing steps by eliminating the independent fixing step while preserving the advantage of the prior art dry process that is the advantage of short and simple steps. Moreover, the adhesive power of the phosphor film is improved to withstand washing, thereby improving color purity and brightness of the fluorescent screen.

What is claimed is:

1. A method of forming a fluorescent screen of a color picture tube comprising the steps of:
   A. applying to the inner surface of a face plate of said tube a film comprising a mixture of a photosensitive binder selected from the group consisting of ammonium dichromate, a benzene chloride diazonium salt, and a diazo resin, and a photosensitive composition consisting essentially of a diazonium salt in a film-forming resin, said diazonium salt being capable of forming zinc chloride upon exposure to light;
   B. exposing to light a predetermined portion of said film to be deposited with phosphors thereby rendering sticky said portion by a photoreaction created by said light exposure of the photosensitive composition and moisture in atmosphere, and causing the photosensitive composition and photosensitive binder to undergo a cross-linkage reaction whereby the exposed area becomes insoluble in washing fluids;
   C. depositing a powder of phosphors onto said predetermined portion whereby the powder sticks thereto as a result of the photoreaction; and
   D. washing the deposited film with a member in which said exposed portion of film is insoluble, said member selected from the group consisting of water, organic solvents, mixtures thereof, and solutions of inorganic compounds, thereby removing the non-adhered phosphor powders from the non-exposed portions of the said film.

2. The method according to claim 1 wherein said binder comprises ammonium dichromate.

3. The method according to claim 1 wherein said binder comprises benzene chloride diazonium sulfonic acid soda.

4. The method according to claim 1 wherein said binder comprises a diazo resin.

* * * * *